United States Patent
Li et al.

(10) Patent No.: US 12,222,652 B2
(45) Date of Patent: Feb. 11, 2025

(54) SQUEEZING DEVICE, PHOTORESIST SUPPLY SYSTEM AND PHOTORESIST SUPPLY METHOD

(71) Applicant: CHANGXIN MEMORY TECHNOLOGIES, INC., Hefei (CN)

(72) Inventors: Shengjiao Li, Anhui (CN); Chia Jen Tung, Anhui (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 579 days.

(21) Appl. No.: 17/598,730

(22) PCT Filed: May 2, 2021

(86) PCT No.: PCT/CN2021/091799
§ 371 (c)(1),
(2) Date: Sep. 27, 2021

(87) PCT Pub. No.: WO2021/227909
PCT Pub. Date: Nov. 18, 2021

(65) Prior Publication Data
US 2023/0314947 A1  Oct. 5, 2023

(30) Foreign Application Priority Data
May 12, 2020 (CN) .......................... 202010396944.0

(51) Int. Cl.
*B65D 83/00* (2006.01)
*G01D 21/02* (2006.01)
(Continued)

(52) U.S. Cl.
CPC ........... *G03F 7/16* (2013.01); *B65D 83/0005* (2013.01); *G01D 21/02* (2013.01); *H01L 21/6715* (2013.01)

(58) Field of Classification Search
CPC ...... G03F 7/16; B65D 83/0005; G01D 21/02; H01L 21/6715
See application file for complete search history.

(56) References Cited

U.S. PATENT DOCUMENTS 2,558,916 A  *  7/1951  Snyder ................. B65D 35/285
                                                    222/102
4,054,231 A  * 10/1977  Eloranta ................... G03D 9/02
                                                    222/102

(Continued)

FOREIGN PATENT DOCUMENTS

CN      202423237 U    9/2012
CN      103645606 A    3/2014
(Continued)

OTHER PUBLICATIONS

Translation CN-205429012-U; Qu, Li-tao (Year: 2016).*
International Search Report and Written Opinion dated Jul. 26, 2021 for Application No. PCT/CN2021/091799.

*Primary Examiner* — Frederick C Nicolas
(74) *Attorney, Agent, or Firm* — Kilpatrick Townsend & Stockton LLP

(57) ABSTRACT

Embodiments of the present application provide a squeezing device, a photoresist supply system, and a photoresist supply method. The squeezing device includes: a base, configured to bear a photoresist bottle; a support rail, vertically arranged on the base; a squeezing structure, an end of the squeezing structure is movably arranged on the support rail so that the squeezing structure moves up and down along the rail direction of the support rail; and a driving module, configured to drive the squeezing structure to deform the squeezing structure so as to reduce the area of a region enclosed by the squeezing structure, and also configured to drive the deformed squeezing structure so that the squeezing structure moves up and down along the rail direction of the support (Continued)

rail. By squeezing the photoresist bottle by the squeezing device, the utilization rate of the photoresist in the photoresist bottle is improved.

12 Claims, 4 Drawing Sheets

(51) Int. Cl.
*G03F 7/16* (2006.01)
*H01L 21/67* (2006.01)

(56) References Cited

U.S. PATENT DOCUMENTS

| | | | | |
|---|---|---|---|---|
| 4,331,265 A | * | 5/1982 | Warlick | B65D 35/28 222/101 |
| 4,421,252 A | * | 12/1983 | Ylitalo | B65D 35/285 222/105 |
| 4,607,763 A | * | 8/1986 | Wright | B65D 35/285 53/391 |
| 5,050,773 A | * | 9/1991 | Choi | B65D 35/285 222/102 |
| 5,215,218 A | * | 6/1993 | Choi | B65D 35/285 222/96 |
| 6,454,133 B1 | * | 9/2002 | Lopez | B65D 35/285 222/105 |
| 7,661,559 B1 | * | 2/2010 | Tresenfeld | A47B 81/00 222/93 |
| 2006/0137419 A1 | | 6/2006 | Mizohata | |
| 2010/0108717 A1 | * | 5/2010 | Szymanski | B65D 35/34 222/100 |

FOREIGN PATENT DOCUMENTS

| | | |
|---|---|---|
| CN | 105346815 A | 2/2016 |
| CN | 205429012 U | 8/2016 |
| CN | 209486466 U | 10/2019 |
| CN | 110586415 A | 12/2019 |

* cited by examiner

SQUEEZING DEVICE, PHOTORESIST SUPPLY SYSTEM AND PHOTORESIST SUPPLY METHOD

CROSS-REFERENCE TO RELATED APPLICATIONS

The present application is an application under 35 U.S.C. 371 of International Application No. PCT/CN2021/091799 filed on May 2, 2021, which claims priority to Chinese Patent Application No. 202010396944.0, titled "Squeezing device, photoresist supply system and photoresist supply method", filed on May 12, 2020, each of which is incorporated herein by reference in its entirety.

TECHNICAL FIELD

The present application relates to the technical field of semiconductors, and in particular to a squeezing device, a photoresist supply system, and a photoresist supply method.

BACKGROUND

Photoresist is a key material for fine patterning in the microelectronics technology. Especially, the development of large-scale and very large-scale integrated circuits in recent years greatly contributes to the research, development and application of photoresist. Usually, the photoresist is placed in a photoresist bottle, and the photoresist is extracted by applying a pressure to the photoresist bottle through nitrogen gas. By this method, the utilization rate of photoresist is low.

In order to improve the utilization rate of photoresist, the photoresist bottle is placed obliquely. However, the residual rate of photoresist is still high.

SUMMARY

Embodiments of the present application provide a squeezing device, a photoresist supply system, and a photoresist supply method. By squeezing the photoresist bottle by the squeezing device, the utilization rate of the photoresist in the photoresist bottle is improved.

In order to solve the technical problem, an embodiment of the present application provides a squeezing device, comprising: a base, configured to bear a photoresist bottle; a support rail, vertically arranged on the base; a squeezing structure, an end of the squeezing structure is movably arranged on the support rail so that the squeezing structure moves up and down along the rail direction of the support rail; and a driving module, configured to drive the squeezing structure to deform the squeezing structure so as to reduce the area of a region enclosed by the squeezing structure, and also configured to drive the deformed squeezing structure so that the squeezing structure moves up and down along the rail direction of the support rail.

Compared with the related art, the squeezing structure is driven by the driving module to squeeze the photoresist bottle, so that the photoresist bottle is in the horizontal plane of the squeezing structure, and the utilization rate of the photoresist in the photoresist bottle is high; and since the squeezing structure is driven by the driving module to move up and down along the rail direction of the support rail, the squeezing structure can squeeze different planes of the photoresist bottle, so that the utilization rate of the photoresist in the photoresist bottle is high.

In one of the embodiments, the support rail comprises a first rail and a second rail; the first rail and the second rail are vertically arranged on the base; one end of the squeezing structure is movably arranged on the first rail, and the other end of the squeezing structure is movably arranged on the second rail; and the driving module is configured to drive the squeezing structure between the first rail and the second rail so as to reduce the area of the region enclosed by the squeezing structure. The first rail and the second rail jointly support the squeezing structure, to fix the two ends of the squeezing structure, in order to improve the effect of the squeezing structure in squeezing the photoresist bottle.

In one of the embodiments, the support rail is movably arranged on the base; the driving module is configured to drive the squeezing structure between the first rail and the second rail, comprising: the driving module is configured to drive the support rail to move in a horizontal direction to enable the squeezing structure to move, to deform the squeezing structure, so as to reduce the area of the region enclosed by the squeezing structure.

In one of the embodiments, the squeezing structure is a closed ring structure.

In one of the embodiments, the squeezing device further comprises a fixing unit, arranged on the base to fix the photoresist bottle placed on the base. The photoresist bottle is fixed by the fixing unit. This prevents the photoresist bottle from moving along with the movement of the squeezing structure to affect the squeezing effect of the squeezing structure.

In one of the embodiments, the squeezing device further comprises a first detection module, configured to detect the liquid level of the photoresist in the photoresist bottle and communicatively connected to the driving module, the driving module driving the deformed squeezing structure to move away from the base based on the detected liquid level. Through the first detection module, the liquid level of the photoresist is detected, so as to control the driving module to drive the squeezing structure. This realizes the automation of the squeezing process.

In one of the embodiments, the first detection module comprises: a first sensing unit, configured to detect whether the liquid level is lower than a first warning level, wherein the driving module is communicatively connected to the first sensing unit, and when the first detection module detects that the liquid level is lower than the first warning level, the driving module drives the deformed squeezing structure so that the squeezing structure moves away from the base along the rail direction of the support rail; and a second sensing unit, configured to detect whether the liquid level is lower than a second warning level, the second warning level being lower than the first warning level, the second warning level indicating the liquid level when the photoresist runs out. By detecting the liquid level of the photoresist by the second sensing unit, the sufficiency or not of the photoresist in the photoresist bottle may be known.

In one of the embodiments, the first detection module further comprises: a first alarm unit, communicatively connected to the first sensing unit and configured to send first alarm information when the first sensing unit detects that the liquid level is lower than the first warning level; and a second alarm unit, communicatively connected to the second sensing unit and configured to send second alarm information when the second sensing unit detects that the liquid level is lower than the second warning level. The liquid level of the photoresist is monitored in real time by the alarm unit, and the relevant staff is notified of alarm information to ensure that the squeezing device is in a normal operating state.

In one of the embodiments, the squeezing device further comprises: a second detection module, located on the squeezing structure and configured to detect the shape of the squeezing structure during the deformation of the squeezing structure; and the driving module is communicatively connected to the second detection module, and when the second detection module detects that the shape of the squeezing structure meets a preset shape, the driving module stops driving the squeezing structure so that the squeezing structure stops deforming. The second detection module detects the shape of the squeezing structure in real time, and the driving module stops driving the squeezing structure when the shape of the squeezing structure meets a preset shape. This avoids unnecessary energy loss.

In one of the embodiments, the squeezing device further comprises: a third detection module, located on the support rail and configured to detect the height of the squeezing structure; and the driving module is communicatively connected to the third detection module, and when the third detection module detects that the height of the squeezing structure reaches a preset maximum height, the driving module controls the squeezing structure to stop moving. The third detection module detects the height of the squeezing structure in real time, and when the preset maximum height is reached, the driving module stops driving the squeezing structure. This prevents the squeezing structure from slipping off the support rail.

An embodiment of the present application further provides a photoresist supply system, comprising: the squeezing device described above and a photoresist bottle placed on the base; the photoresist bottle comprises a bottle body, a bottle bottom, and a bottle cap, the bottle body is configured to store photoresist, and the bottle cap is provided with a through hole and a conduit passing through the through hole and extending from the outside of the photoresist bottle to the inside of the bottle body; the driving module is configured to drive the squeezing structure to deform the squeezing structure, so as to reduce the area of the region enclosed by the squeezing structure, in order to squeeze the photoresist bottle; and the driving module is also configured to drive the squeezing structure so that the squeezing structure moves away from the base along the rail direction of the support rail, so as to ensure that the liquid level of photoresist in the bottle body is within a preset range so that the photoresist flows out through the conduit.

In one of the embodiments, the bottle body comprises a ductile material part and a plastic material part, a region of the bottle body squeezed by the squeezing structure is the plastic material part, and a region of the bottle body not squeezed by the squeezing structure is the ductile material part. By providing a material of the photoresist bottle, the photoresist bottle does not need to be fixed on the base, and the photoresist bottle can also be prevented from moving along with the movement of the squeezing structure.

Compared with the related art, the photoresist bottle is squeezed by the squeezing device, so that the photoresist bottle is in the horizontal plane of the squeezing device, and the utilization rate of the photoresist in the photoresist bottle is high; and since the squeezing device squeezes different planes of the photoresist bottle, the utilization rate of the photoresist in the photoresist bottle is high.

An embodiment of the present application further provides a photoresist supply method, applied to the photoresist supply system, comprising: driving a squeezing structure to deform the squeezing structure, so as to reduce the area of a region enclosed by the squeezing structure, in order to squeeze a photoresist bottle located on a base of the squeezing device; and driving the deformed squeezing structure so that the squeezing structure moves away from the base along the rail direction of the support rail, so as to ensure that the liquid level of photoresist in a photoresist bottle located on the base is within a preset range so that the photoresist flows out through the conduit.

In one of the embodiments, before the driving a squeezing structure to deform the squeezing structure, so as to reduce the area of a region enclosed by the squeezing structure, in order to squeeze a photoresist bottle located on a base of the squeezing device, the method further comprises: sending warning information when it is detected that the liquid level of the photoresist is not within a preset range or the liquid level of the photoresist cannot be detected; and driving, based on the warning information, the squeezing structure to deform the squeezing structure so as to reduce the area of a region enclosed by the squeezing structure, or driving the deformed squeezing structure so that the squeezing structure moves away from the base along the rail direction of the support rail.

In one of the embodiments, sending warning information when it is detected that the liquid level of the photoresist is not within a preset range or the liquid level of the photoresist cannot be detected comprises: detecting whether the liquid level of the photoresist is higher than a first warning level, the first warning level being the highest level of the preset range; and sending the warning information when it is detected that the liquid level of the photoresist is lower than the first warning level.

In one of the embodiments, sending warning information when it is detected that the liquid level of the photoresist is not within a preset range or the liquid level of the photoresist cannot be detected comprises: detecting whether the liquid level of the photoresist is higher than a second warning level, the second warning level being the lowest level of the preset range; and sending alarm information indicating the photoresist runs out, when it is detected that the liquid level of the photoresist is lower than the second warning level or the liquid level of the photoresist cannot be detected.

Compared with the related art, by squeezing the photoresist bottle, the photoresist bottle is in the horizontal plane of the squeezing device, and the utilization rate of the photoresist in the photoresist bottle is high; and since different planes of the photoresist bottle are squeezed, the utilization rate of the photoresist in the photoresist bottle is high.

DETAILED DESCRIPTION

At present, in order to improve the utilization rate of photoresist, the photoresist bottle is placed obliquely. However, the residual rate of photoresist is still high.

In order to solve the problem, an embodiment of the present application provides a squeezing device. The squeezing structure is driven by the driving module to squeeze the photoresist bottle, so that the photoresist bottle is in the horizontal plane of the squeezing structure, and the utilization rate of the photoresist in the photoresist bottle is high; and since the squeezing structure is driven by the driving module to move up and down along the rail direction of the support rail, the squeezing structure can squeeze different planes of the photoresist bottle, so that the utilization rate of the photoresist in the photoresist bottle is high.

To make the objectives, technical solutions and advantages of the embodiments of the present application clearer, the embodiments of the present application will be further described below in detail with reference to the accompanying drawings. However, it may be understood by a person of ordinary skill in the art that, in the embodiments of the present application, many technical details are provided for the better understanding of the present application. However, the technical solutions sought to be protected by the present application can be implemented, even without these technical details and various changes and modifications based on the following embodiments. The following divisions of the various embodiments are for convenience of description, and should not constitute any limitation to the specific implementation of the present application, and the various embodiments may be combined with each other if not conflict.

Figure 1:
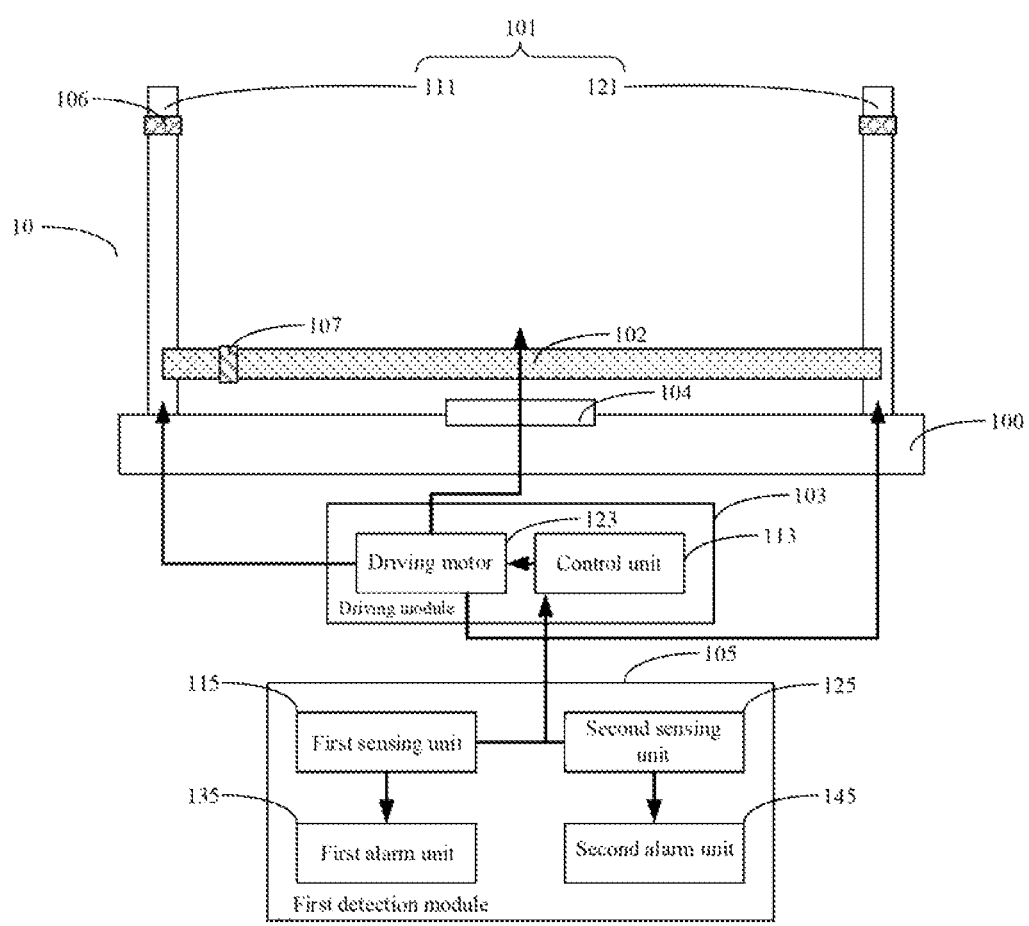
FIG. 1 is a schematic structure diagram of a squeezing device according to an embodiment of the present application.
Figure 2:
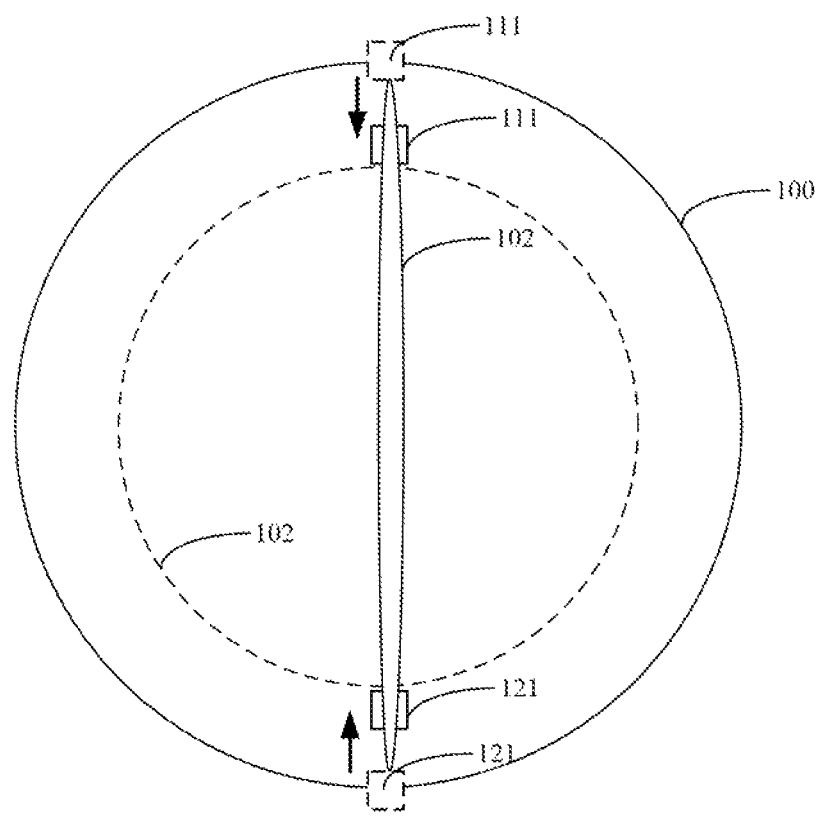
FIG. 2 is a squeezing principle diagram of a squeezing structure according to an embodiment of the present application.

FIG. 1 is a schematic structure diagram of a squeezing device according to an embodiment of the present application; and FIG. 2 is a squeezing principle diagram of a squeezing structure according to an embodiment of the present application. The squeezing device 10 in this embodiment will be described in detail below with reference to the accompanying drawings.

Referring to FIG. 1, the squeezing device 10 comprises: a base 100, configured to bear a photoresist bottle (not shown); a support rail 101, vertically arranged on the base 100; a squeezing structure 102, an end of the squeezing structure is movably arranged on the support rail 101 so that the squeezing structure 102 moves up and down along the rail direction of the support rail 101; and a driving module 103, configured to drive the squeezing structure to deform the squeezing structure 102 so as to reduce the area of a region enclosed by the squeezing structure 102, and also configured to drive the deformed squeezing structure 102 so that the squeezing structure 102 moves up and down along the rail direction of the support rail 101.

In this embodiment, the support rail 101 comprises: a first rail 111 and a second rail 121; the first rail 111 and the second rail 121 are vertically arranged on the base 100; one end of the squeezing structure 102 is movably arranged on the first rail 1i1, and the other end of the squeezing structure 102 is movably arranged on the second rail 121; and the driving module 103 is configured to drive the squeezing structure 102 between the first rail 111 and the second rail 121 so as to reduce the area of the region enclosed by the squeezing structure 102. The first rail 111 and the second rail 121 jointly support the squeezing structure 102, to fix the two ends of the squeezing structure 102, in order to improve the effect of the squeezing structure 102 in squeezing the photoresist bottle.

Specifically, the support rail 101 is movably arranged on the base 100; the driving module 103 is configured to drive the squeezing structure 102 between the first rail 111 and the second rail 121, comprising: the driving module 103 is configured to drive the support rail 101 to move in a horizontal direction to enable the squeezing structure 102 to move, to deform the squeezing structure 102, so as to reduce the area of the region enclosed by the squeezing structure 102.

Referring to FIG. 2, FIG. 2 is a top view of the squeezing structure 102 having a base 100 located in a circular region.

In the initial state, the first rail 111 and the second rail 121 are located at the edge of the base 100 (as shown by the dashed line in the figure), and the squeezing structure 102 is a closed ring structure (as shown by the dashed line in the figure). The photoresist bottle is placed in the region enclosed by the squeezing structure 102. As the driving module drives the first rail 111 and the second rail 121 to approach each other in the direction of the connection line, the squeezing structure 102 between the first rail Ill and the second rail 121 is squeezed inward, and the squeezing structure 102 becomes an ellipse from a circle. As the first rail 111 and the second rail 121 move, the eccentricity of the ellipse enclosed by the squeezing structure 102 gradually increases, and finally the ellipse approaches two close straight lines. As the eccentricity of the ellipse enclosed by the squeezing structure 102 increases, that is, the region enclosed by the squeezing structure 102 reduces, in the horizontal plane of the squeezing structure, the amount of photoresist contained in the photoresist bottle reduces, and eventually approaches 0, so that the remaining amount of photoresist is reduced in the horizontal plane of the squeezing structure 102, thereby improving the utilization rate of the photoresist.

It should be noted that this embodiment uses the specific first rail 111 and second rail 121 as a specific implementation solution of the support rail 101, which does not constitute any limitation to the solution. In other embodiments, only one support rail or a plurality of support rails may be possible. It may be understood by those skilled in the art that, in this embodiment, the support rail is configured to provide a fulcrum for the up and down movement of the squeezing structure, and is used to realize the deformation of the squeezing structure. Related devices that have such functions shall be included in the protection scope of the present application.

Still referring to FIG. 1, in this embodiment, the squeezing device 10 further comprises: a first detection module 105, configured to detect the liquid level of the photoresist in the photoresist bottle and communicatively connected to the driving module 103, the driving module 103 driving the deformed squeezing structure 102 to move away from the base 100 based on the detected liquid level. Through the first detection module 105, the liquid level of the photoresist is detected, so as to control the driving module 103 to drive the squeezing structure 102. This realizes the automation of the squeezing process.

Specifically, the first detection module comprises a first sensing unit 115 and a second sensing unit 125. The first sensing unit 115 is configured to detect whether the liquid level is lower than a first warning level, the driving module 115 is communicatively connected to the driving module 103, and when the first detection module detects that the liquid level is lower than the first warning level, the driving module 103 drives the deformed squeezing structure 102 so that the squeezing structure 102 moves away from the base 100 along the rail direction of the support rail 101.

In specific applications, as the photoresist in the photoresist bottle is used, the liquid level of the photoresist in the photoresist bottle falls. When the liquid level of the photoresist falls to a first warning level, the driving module 103 drives the squeezing structure 102 to squeeze the photoresist bottle. Due to the squeezing of the squeezing structure 102, the volume of the photoresist bottle in the same horizontal plane as the squeezing structure 102 is reduced, and the liquid level of the photoresist rises correspondingly. As the photoresist is used, the squeezing structure 102 continues squeezing up to the minimum position. In this case, the driving module 103 drives the squeezing structure 102 to move away from the base 100 along the rail direction of the support rail 101 to squeeze the photoresist bottle in different planes, so that the liquid level of the photoresist in the photoresist bottle rises. As the squeezing structure 102 moves away from the base 100 along the rail direction of the support rail 101, when the squeezing structure 102 moves to the highest point, the utilization rate of the photoresist in the photoresist bottle below the height of the squeezing structure 102 is high.

The second sensing unit 125 is configured to detect whether the liquid level is lower than a second warning level, the second warning level being lower than the first warning level, the second warning level indicating the liquid level when the photoresist runs out.

In specific applications, with the use of photoresist and the squeezing of the squeezing structure 102, the liquid level of the photoresist is always near the first warning level. When the squeezing structure 102 is unable to squeeze the photoresist bottle, as the photoresist is used, the liquid level of the photoresist continuously falls to the second warning level, indicating that the photoresist in the photoresist bottle is about to run out. By the second sensing unit 125, the relevant staff may be notified in time to replace with a new photoresist bottle, so as to ensure the continuous supply of photoresist and prevent the lack of photoresist from influencing the progress of the semiconductor manufacturing process.

Specifically, the first warning level is set to a level at which the conduit can smoothly suck the photoresist out of the photoresist bottle, and the liquid level of the photoresist is higher than the first warning level to ensure the supply of photoresist. The second warning level is set to the height of the conduit opening. When the liquid level of the photoresist is lower than the height of the conduit opening or the liquid level of the photoresist cannot be detected, the photoresist in the photoresist bottle runs out. Warning information, which indicates that the photoresist runs out, is given to notify the relevant staff to replace with a new photoresist bottle.

Correspondingly, the first detection module 105 further comprises a first alarm unit 135 and a second alarm unit 145. The first alarm unit 135 is communicatively connected to the first sensing unit 115 and configured to send first alarm information when the first sensing unit 115 detects that the liquid level is lower than the first warning level. The second alarm unit 145 is communicatively connected to the second sensing unit 125 and configured to send second alarm information when the second sensing unit 125 detects that the liquid level is lower than the second warning level. Through the first alarm information and the second alarm information, the relevant staff can be notified in time to detect the specific operating conditions of the squeezing device 10 so as to ensure that the squeezing device 10 is in a normal operating state.

In specific applications, the first alarm information and the second alarm information may be implemented by alarm bells of different frequencies, or may be implemented by sending the alarm information to the relevant operating platform for displaying. It may be understood by those skilled in the art that devices and alarm conditions that meet the working mode of the first detection module 105 of the present application shall all fall into the protection scope of the present application.

In this embodiment, the squeezing device 10 further comprises: a second detection module 107, located on the squeezing structure 102 and configured to detect the shape of the squeezing structure 102 during the deformation of the squeezing structure 102. The driving module 103 is communicatively connected to the second detection module 107, and when the second detection module 107 detects that the shape of the squeezing structure 102 meets a preset shape, the driving module 103 stops driving the squeezing structure 102 so that the squeezing structure 102 stops deforming.

In specific applications, the second detection module 107 may be implemented by a sensor located on the sidewall of the squeezing structure 102. During the squeezing process of the squeezing structure 102, the region enclosed by the squeezing structure 102 is reduced. That is, the distance between an end of the squeezing structure 102 comprising the sensor and the other end, which is detected by the sensor, is gradually decreased. By converting the preset shape into the preset distance, when the distance detected by the sensor meets the preset distance, the shape of the squeezing structure 102 meets the preset shape. The second detection module 107 detects the shape of the squeezing structure 102 in real time, and the driving module stops driving the squeezing structure when the shape of the squeezing structure meets a preset shape. This avoids unnecessary energy loss.

In this embodiment, the squeezing device 10 further comprises: a third detection module 106, located on the support rail 101 and configured to detect the height of the squeezing structure 102. The driving module 103 is communicatively connected to the third detection module 106, and when the third detection module 106 detects that the height of the squeezing structure 102 reaches the preset maximum height, the driving module 103 controls the squeezing structure 102 to stop moving.

Specifically, the preset maximum height is flush with the second warning level to ensure that the photoresist in the photoresist bottle runs out, and to further ensure that the residual amount of photoresist in the photoresist bottle is low.

In specific applications, the third detection module 106 may be a sensor located at a preset maximum height of the support rail. When the squeezing structure 102 moves away from the base 100 along the rail direction of the support rail 101 and then touches the sensor, the height of the squeezing structure 102 reaches the preset maximum height. The third detection module 106 detects the height of the squeezing structure 102 in real time, and when the preset maximum height is reached, the driving module stops driving the squeezing structure 102. This prevents the squeezing structure 102 from slipping off the support rail.

It should be noted that, in this embodiment, the position setting of the second detection module 107 and the third detection module 106 is just to facilitate the understanding of those skilled in the art. In specific applications, both the second detection module 107 and the third detection module 106 may be arranged on the base 100, the squeezing structure 102, or the support rail 101, etc., as long as the preset shape and the preset maximum height of the squeezing structure 102 can be detected.

In one of the embodiments, in this embodiment, the squeezing device 10 further comprises a fixing unit 104, arranged on the base 100 to fix the photoresist bottle placed on the base 100. The photoresist bottle is fixed by the fixing unit 104. This prevents the photoresist bottle from moving along with the movement of the squeezing structure 102 to affect the squeezing effect of the squeezing structure 102.

In this embodiment, the driving module 103 comprises a control unit 113 and a driving motor 123. The control unit 113 is communicatively connected to the first detection module, the second detection module or the third detection module, and configured to control the operation of the driving motor 123. The driving motor 123 is configured to drive the squeezing structure 102 so that the squeezing structure 102 moves up and down along the rail direction of the support rail 101, and also configured to drive the squeezing structure 102 to deform the squeezing structure 102 to reduce the area of the region enclosed by the squeezing structure 102.

Compared with the related art, the squeezing structure 102 is driven by the driving module 103 to squeeze the photoresist bottle, so that the photoresist bottle is in the horizontal plane of the squeezing structure 102, and the utilization rate of the photoresist in the photoresist bottle is high; and since the squeezing structure 102 is driven by the driving module 103 to move up and down along the rail direction of the support rail 101, the squeezing structure 102 can squeeze different planes of the photoresist bottle, so that the utilization rate of the photoresist in the photoresist bottle is high.

It is to be noted that the units involved in this embodiment are logical units. In practical applications, a logical unit may be a physical unit, or part of a physical unit, or a combination of multiple physical units. In one of the embodiments, in order to highlight the innovativeness of the present application, in this embodiment, units that are not closely related to solving the technical problem proposed by the present application are not introduced. However, this does not indicate the absence of other units in this embodiment.

Another embodiment of the present application relates to a photoresist supply system. The photoresist supply system in this embodiment will be described in detail below with reference to the accompanying drawings.

Figure 3:
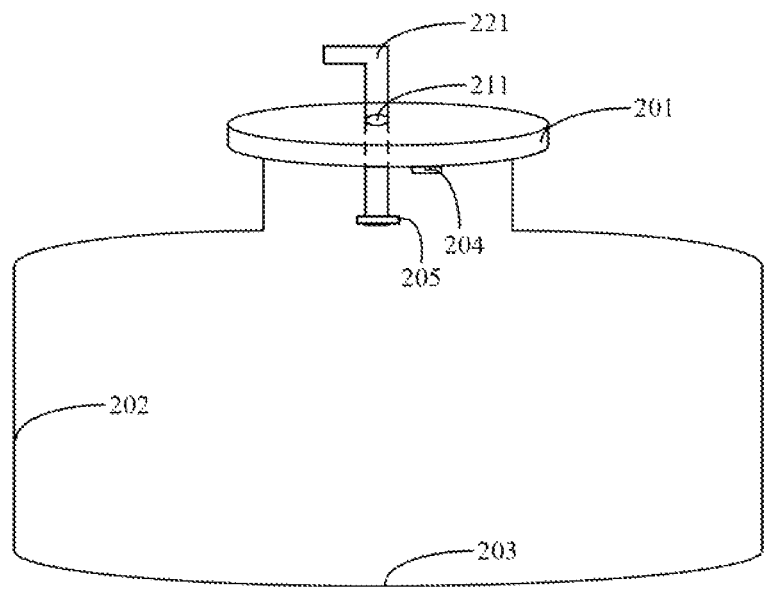
FIG. 3 is a schematic structure diagram of a photoresist bottle according to another embodiment of the present application.
Figure 4:
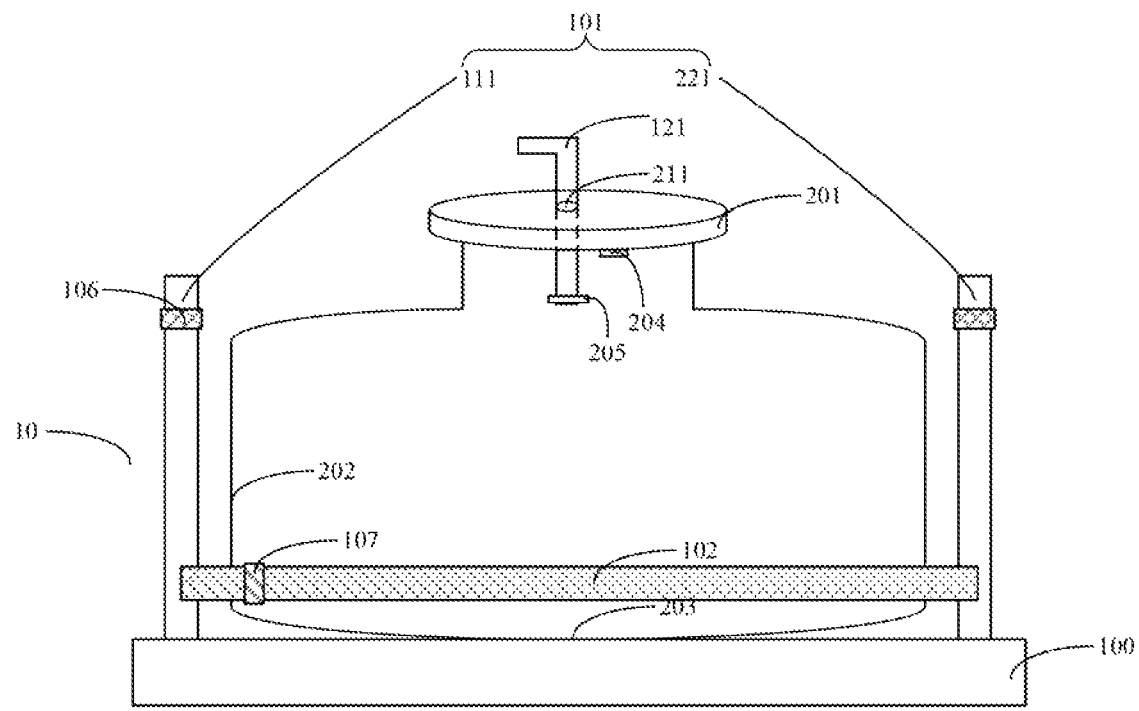
FIG. 4 is a schematic structure diagram of a photoresist supply system according to another embodiment of the present application.

Referring to FIGS. 3 and 4, the photoresist supply system comprises the squeezing device 10 and a photoresist bottle placed on a base of the squeezing device 10.

The photoresist bottle comprises a bottle body 202, a bottle bottom 203, and a bottle cap 201, the bottle body 202 is configured to store photoresist, and the bottle cap 201 is provided with a through hole 211 and a conduit 221 passing through the through hole 211 and extending from the outside of the photoresist bottle to the inside of the bottle body, the driving module 103 of the squeezing device 10 is configured to drive the squeezing structure 102 to deform the squeezing structure 102, so as to reduce the area of the region enclosed by the squeezing structure 102, in order to squeeze the photoresist bottle; and the driving module 103 is also configured to drive the squeezing structure 102 so that the squeezing structure 102 moves away from the base 100 along the rail direction of the support rail 101, so as to ensure that the liquid level of photoresist in the bottle body is within a preset range so that the photoresist flows out through the conduit.

In this embodiment, the squeezing device 10 further comprises a first detection module (not shown). The first detection module (not shown) is configured to detect the liquid level of the photoresist in the photoresist bottle and communicatively connected to the driving module 103 of the squeezing device 10. When the first detection module (not shown) detects that the liquid level of the photoresist is not within the preset range or the liquid level of the photoresist cannot be detected, warning information is sended. The driving module 103 receives the warning information, and drives the squeezing structure 102 to deform the squeezing structure 102 so as to reduce the area of the region enclosed by the squeezing structure 102 or drives the deformed squeezing structure 102 so that the squeezing structure 102 moves away from the base 100 along the rail direction of the support rail 101.

Specifically, the first detection module comprises a first sensing unit 204 and a second sensing unit 205.

Figure 5:
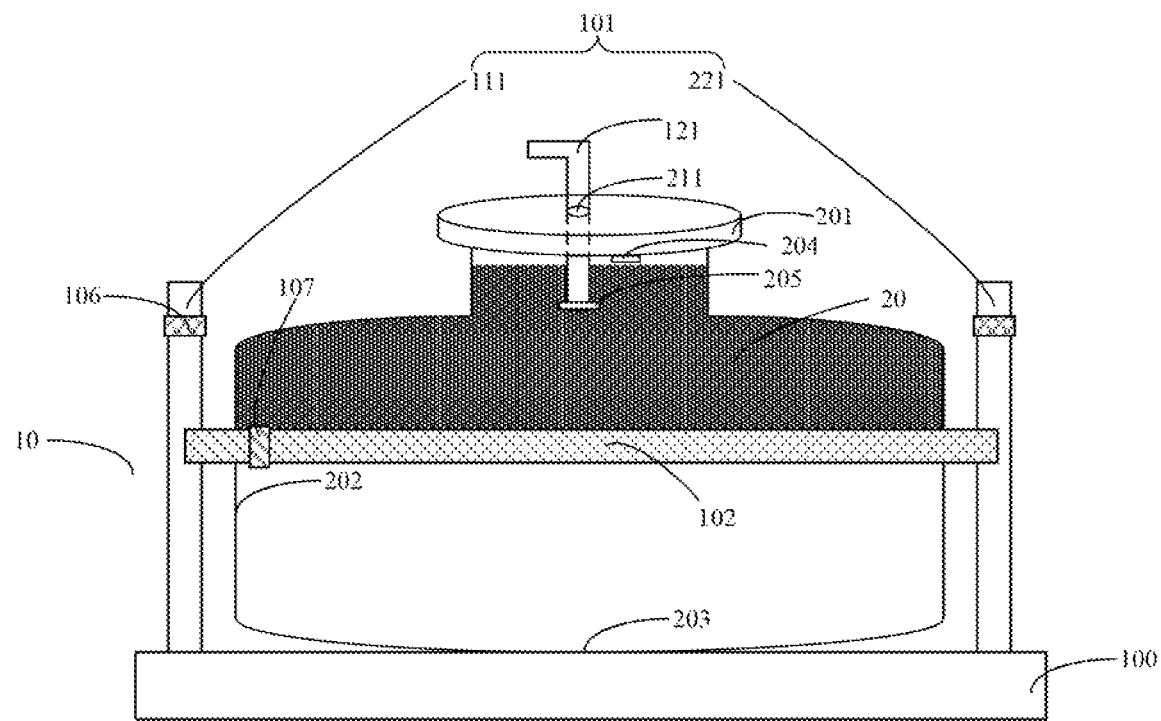
FIGS. 5-7 are schematic view of the operation of the photoresist supply system according to another embodiment of the present application.
Figure 6:
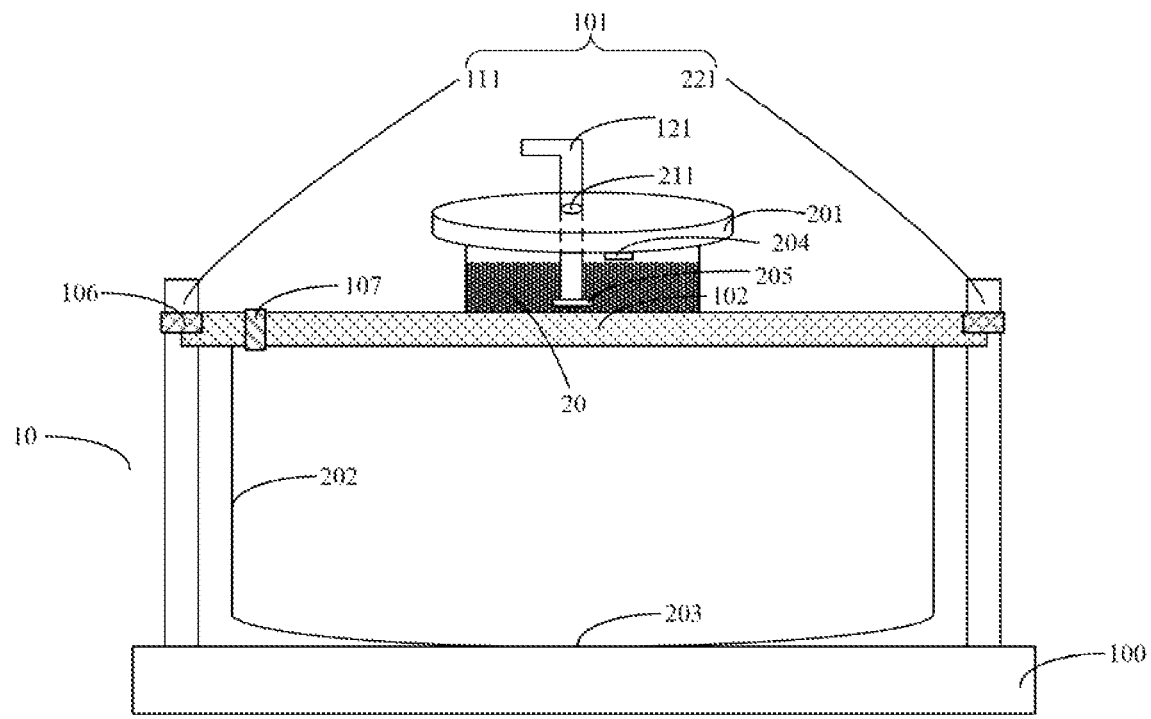
Figure 7:
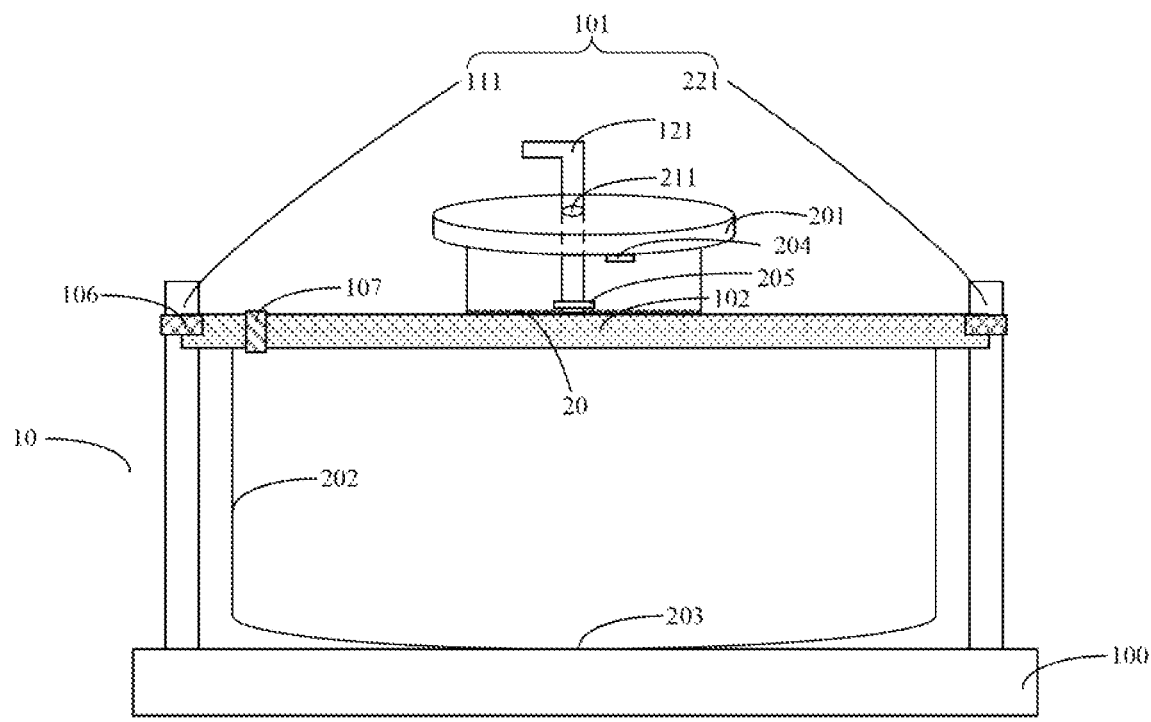

Referring to FIGS. 5-7, the first sensing unit 204 is arranged at the bottom of the bottle cap 201. The first sensing unit 204 is configured to detect whether the liquid level of the photoresist 20 is higher than the first warning level, the first warning level being the highest level of the preset range. When the first sensing unit 204 detects that the liquid level of the photoresist 20 is lower than the first warning level, warning information is sended;

In specific applications, as the photoresist 20 in the photoresist bottle is used, the liquid level of the photoresist 20 in the photoresist bottle falls. When the liquid level of the photoresist 20 falls to a first warning level, the driving module 103 drives the squeezing structure 102 to squeeze the photoresist bottle. Due to the squeezing of the squeezing structure 102, the volume of the photoresist bottle in the same horizontal plane as the squeezing structure 102 is reduced, and the liquid level of the photoresist 20 rises correspondingly. As the photoresist 20 is used, the squeezing structure 102 continues squeezing up to the minimum position. In this case, the driving module 103 drives the squeezing structure 102 to move away from the base 100 along the rail direction of the support rail 101 to squeeze the photoresist bottle in different planes, so that the liquid level of the photoresist 20 in the photoresist bottle rises. As the squeezing structure 102 moves away from the base 100 along the rail direction of the support rail 101, when the squeezing structure 102 moves to the highest point, the utilization rate of the photoresist 20 in the photoresist bottle below the height of the squeezing structure 102 is high.

The second sensing unit 205 is arranged at the opening of the conduit 221. The second sensing unit 205 is configured to detect whether the liquid level of the photoresist 20 is higher than the second warning level, the second warning level being the lowest level of the preset range. When the second sensing unit 205 detects that the liquid level of the photoresist 20 is lower than the second warning level or the liquid level of the photoresist 20 cannot be detected, warning information which indicates that the photoresist runs out is sended.

In specific applications, with the use of photoresist 20 and the squeezing of the squeezing structure 102, the liquid level of the photoresist 20 is always near the first warning level. When the squeezing structure 102 is unable to squeeze the photoresist bottle, as the photoresist 20 is used, the liquid level of the photoresist 20 continuously falls to the second warning level, indicating that the photoresist 20 in the photoresist bottle is about to run out. By the second sensing unit 125, the relevant staff may be notified in time to replace with a new photoresist bottle, so as to ensure the continuous supply of photoresist 20 and prevent the lack of photoresist 20 from influencing the progress of the semiconductor manufacturing process.

It should be noted that, in this embodiment, the position setting of the first sensing unit 204 and the second sensing unit 205 is just to facilitate the understanding of those skilled in the art. In specific applications, both the first sensing unit 204 and the second sensing unit 205 may be arranged on the wall of the bottleneck of the photoresist bottle or the bottom of the bottle cap, as long as the liquid level of the photoresist 20, at which the squeezing structure is to be driven, can be detected and the liquid level at which the photoresist 20 runs out can be detected.

Through the first sensing unit 204 and the second sensing unit 205, the liquid level of the photoresist 20 is detected, so as to control the driving module 103 to drive the squeezing structure. This realizes the automation of the squeezing process.

In one of the embodiments, the bottle body 202 comprises a ductile material part and a plastic material part, a region of the bottle body 202 squeezed by the squeezing structure 102 is the plastic material pan, and a region of the bottle body 202 not squeezed by the squeezing structure 102 is the ductile material part. The region squeezed by the squeezing structure 102 is made of a plastic material, which is convenient for the squeezing structure 102 to squeeze the photoresist bottle. The region not squeezed by the squeezing structure 102 (the region adjacent to the support rail 101) is made of a ductile material, which prevents the photoresist bottle from moving along with the movement of the squeezing structure 102 to affect the squeezing effect of the squeezing structure 102. In other embodiments, the photoresist bottle placed on the base 100 may be fixed by the fixing unit 104 arranged on the base 100, which prevents the photoresist bottle from moving along with the movement of the squeezing structure 102 to affect the squeezing effect of the squeezing structure 102.

Compared with the related art, the photoresist bottle is squeezed by the squeezing device 10, so that the photoresist bottle is in the horizontal plane of the squeezing device 10, and the utilization rate of the photoresist 20 in the photoresist bottle is high; and since the squeezing device 10 squeezes different planes of the photoresist bottle, the utilization rate of the photoresist 20 in the photoresist bottle is high.

It is to be noted that the units involved in this embodiment are logical units. In practical applications, a logical unit may be a physical unit, or part of a physical unit, or a combination of multiple physical units. In one of the embodiments, in order to highlight the innovativeness of the present application, in this embodiment, units that are not closely related to solving the technical problem proposed by the present application are not introduced. However, this does not indicate the absence of other units in this embodiment.

Since the above embodiment and this embodiment correspond to each other, this embodiment may be implemented in cooperation with the above embodiment. The relevant technical details mentioned in the above embodiment are still applicable to this embodiment, and the technical effects that can be achieved in the above embodiment can also be achieved in this embodiment. For the purpose of clarity, they will not be repeated here. Correspondingly, related technical details mentioned in this embodiment are applicable to the previous embodiment.

Another embodiment of the present application relates to a photoresist supply method. Specifically, the photoresist supply method is applied to the squeezing device. The photoresist supply method comprises: driving a squeezing structure to deform the squeezing structure, so as to reduce the area of a region enclosed by the squeezing structure, in order to squeeze a photoresist bottle located on a base of the squeezing device; or driving the squeezing structure so that the squeezing structure moves away from the base along the rail direction of the support rail, so as to ensure that the liquid level of photoresist in a photoresist bottle located on the base is within a preset range so that the photoresist flows out through the conduit.

The method provides a squeezing device to squeeze the photoresist bottle to implement a method of improving the utilization rate of the photoresist stored in the photoresist bottle. The automated squeezing of the photoresist bottle by the squeezing device will be described in detail.

Step A1: It is detected whether the liquid level of the photoresist is within a preset range.

Before driving a squeezing structure to deform the squeezing structure, so as to reduce the area of a region enclosed by the squeezing structure, in order to squeeze a photoresist bottle located on a base of the squeezing device, the method further comprises: detecting the liquid level of the photoresist.

In this embodiment, sending warning information when it is detected that the liquid level of the photoresist is not within a preset range or the liquid level of the photoresist cannot be detected comprises: detecting whether the liquid level of the photoresist is higher than a first warning level, the first warning level being the highest level of the preset range; and sending the warning information when it is detected that the liquid level of the photoresist is lower than the first warning level. Sending warning information when it is detected that the liquid level of the photoresist is not within a preset range or the liquid level of the photoresist cannot be detected comprises: detecting whether the liquid level of the photoresist is higher than a second warning level, the second warning level being the lowest level of the preset range; and sending alarm information indicating the photoresist runs out, when it is detected that the liquid level of the photoresist is lower than the second warning level or the liquid level of the photoresist cannot be detected.

Specifically, the first warning level is set to a level at which the conduit can smoothly suck the photoresist out of the photoresist bottle, and the liquid level of the photoresist is higher than the first warning level to ensure the supply of photoresist. The second warning level is set to the height of the conduit opening. When the liquid level of the photoresist is lower than the height of the conduit opening or the liquid level of the photoresist cannot be detected, the photoresist in the photoresist bottle runs out. Warning information, which indicates that the photoresist runs out, is given to notify the relevant staff to replace with a new photoresist bottle.

That is, when the liquid level of the photoresist is within the preset range, step A2 is executed; when the liquid level of the photoresist is not within the preset range and the liquid level of the photoresist is higher than the second warning level, step A3 is executed; and when the liquid level of the photoresist is not within the preset range and the liquid level of the photoresist is lower than the second warning level, or when the liquid level of the photoresist cannot be detected, step A4 is executed.

Step A2: the step A1 is continuously executed.

Step A3: Based on the warning information, the squeezing structure is driven to squeeze the photoresist bottle.

Specifically, based on the warning information, the squeezing structure is driven, to deform the squeezing structure, so as to reduce the area of a region enclosed by the squeezing structure, or the deformed squeezing structure is driven so that the squeezing structure moves away from the base along the rail direction of the support rail.

In specific applications, as the photoresist in the photoresist bottle is used, the liquid level of the photoresist in the photoresist bottle falls. When the liquid level of the photoresist falls to a first warning level, the driving module 103 drives the squeezing structure 102 to squeeze the photoresist bottle. Due to the squeezing of the squeezing structure 102, the volume of the photoresist bottle in the same horizontal plane as the squeezing structure 102 is reduced, and the liquid level of the photoresist rises correspondingly. As the photoresist is used, the squeezing structure 102 continues squeezing up to the minimum position. In this case, the driving module 103 drives the squeezing structure 102 to move away from the base 100 along the rail direction of the support rail 101 to squeeze the photoresist bottle in different planes, so that the liquid level of the photoresist in the photoresist bottle rises. As the squeezing structure 102 moves away from the base 100 along the rail direction of the support rail 101, when the squeezing structure 102 moves to the highest point, the utilization rate of the photoresist in the photoresist bottle below the height of the squeezing structure 102 is high.

Step A4: Based on the alarm information indicating the photoresist runs out, an alarm is sended.

Compared with the related art, by squeezing the photoresist bottle, the photoresist bottle is in the horizontal plane of the squeezing device, and the utilization rate of the photoresist in the photoresist bottle is high; and since different planes of the photoresist bottle are squeezed, the utilization rate of the photoresist in the photoresist bottle is high.

Since the above embodiment and this embodiment correspond to each other, this embodiment may be implemented in cooperation with the above embodiment. The relevant technical details mentioned in the above embodiment are still applicable to this embodiment, and the technical effects that can be achieved in the above embodiment can also be achieved in this embodiment. For the purpose of clarity, they will not be repeated here. Correspondingly, related technical details mentioned in this embodiment are applicable to the previous embodiment.

It may be understood by a person of ordinary skill in the art that the above embodiments are specific embodiments for realizing the present application, and in actual applications, various changes may be made to the form and details without departing from the spirit and scope of the present application.

The invention claimed is:

1. A squeezing device, comprising:
   a base, configured to bear a photoresist bottle;
   a support rail, vertically arranged on the base;
   a squeezing structure, an end of the squeezing structure is movably arranged on the support rail so that the squeezing structure moves up and down along a rail direction of the support rail; and
   a driving module, configured to drive the squeezing structure to deform the squeezing structure so as to reduce area of a region enclosed by the squeezing structure, and also configured to drive the deformed squeezing structure so that the squeezing structure moves up and down along the rail direction of the support rail.

2. The squeezing device according to claim 1, wherein the support rail comprises a first rail and a second rail;
   the first rail and the second rail are vertically arranged on the base;
   one end of the squeezing structure is movably arranged on the first rail, and the other end of the squeezing structure is movably arranged on the second rail; and
   the driving module is configured to drive the squeezing structure between the first rail and the second rail so as to reduce the area of the region enclosed by the squeezing structure.

3. The squeezing device according to claim 2, wherein the support rail is movably arranged on the base; the driving module is configured to drive the squeezing structure between the first rail and the second rail, comprising:
   the driving module is configured to drive the support rail to move in a horizontal direction to enable the squeezing structure to move, to deform the squeezing structure, so as to reduce the area of the region enclosed by the squeezing structure.

4. The squeezing device according to claim 1, wherein the squeezing structure is a closed ring structure.

5. The squeezing device according to claim 1, further comprising: a fixing unit, arranged on the base to fix the photoresist bottle placed on the base.

6. The squeezing device according to claim 1, further comprising: a first detection module, configured to detect liquid level of photoresist in the photoresist bottle and communicatively connected to the driving module, the driving module driving the deformed squeezing structure to move away from the base based on the detected liquid level.

7. The squeezing device according to claim 6, wherein the first detection module comprises:
   a first sensing unit, configured to detect whether the liquid level is lower than a first warning level, wherein the driving module is communicatively connected to the first sensing unit, and when the first detection module detects that the liquid level is lower than the first warning level, the driving module drives the deformed squeezing structure so that the squeezing structure moves away from the base along the rail direction of the support rail;
   a second sensing unit, configured to detect whether the liquid level is lower than a second warning level, the second warning level being lower than the first warning level, the second warning level indicating the liquid level when the photoresist runs out.

8. The squeezing device according to claim 7, wherein the first detection module further comprises:
   a first alarm unit, communicatively connected to the first sensing unit and configured to send first alarm information when the first sensing unit detects that the liquid level is lower than the first warning level; and
   a second alarm unit, communicatively connected to the second sensing unit and configured to send second alarm information when the second sensing unit detects that the liquid level is lower than the second warning level.

9. The squeezing device according to claim 1, further comprising:
   a second detection module, located on the squeezing structure and configured to detect shape of the squeezing structure during deformation of the squeezing structure; and
   the driving module is communicatively connected to the second detection module, and when the second detection module detects that the shape of the squeezing structure meets a preset shape, the driving module stops driving the squeezing structure so that the squeezing structure stops deforming.

10. The squeezing device according to claim 1, further comprising:

a third detection module, located on the support rail and configured to detect height of the squeezing structure; and the driving module is communicatively connected to the third detection module, and when the third detection module detects that the height of the squeezing structure reaches a preset maximum height, the driving module controls the squeezing structure to stop moving.

11. A photoresist supply system, comprising: the squeezing device according to claim 1 and the photoresist bottle placed on the base;

the photoresist bottle comprises a bottle body, a bottle bottom, and a bottle cap, the bottle body is configured to store photoresist, and the bottle cap is provided with a through hole and a conduit passing through the through hole and extending from outside of the photoresist bottle to inside of the bottle body;

the driving module is configured to drive the squeezing structure to deform the squeezing structure, so as to reduce the area of the region enclosed by the squeezing structure, in order to squeeze the photoresist bottle; and the driving module is also configured to drive the squeezing structure so that the squeezing structure moves away from the base along the rail direction of the support rail, so as to ensure that liquid level of photoresist in the bottle body is within a preset range so that the photoresist flows out through the conduit.

12. The photoresist supply system according to claim 11, wherein the bottle body comprises a ductile material part and a plastic material part, a region of the bottle body squeezed by the squeezing structure is the plastic material part, and a region of the bottle body not squeezed by the squeezing structure is the ductile material part.

\* \* \* \* \*